United States Patent
Hsiao

(10) Patent No.: US 10,048,719 B2
(45) Date of Patent: Aug. 14, 2018

(54) APPARATUS FOR AUTOMATICALLY CALIBRATING CLOCK OF NON-CRYSTAL OSCILLATOR AND METHOD THEREOF

(71) Applicant: Weltrend Semiconductor Inc., Hsinchu (TW)

(72) Inventor: Fu-Yuan Hsiao, Hsinchu (TW)

(73) Assignee: WELTREND SEMICONDUCTOR INC., Hsinchu (TW)

( * ) Notice: Subject to any disclaimer, the term of this patent is extended or adjusted under 35 U.S.C. 154(b) by 252 days.

(21) Appl. No.: 15/147,410

(22) Filed: May 5, 2016

(65) Prior Publication Data

US 2016/0327973 A1 Nov. 10, 2016

(30) Foreign Application Priority Data

May 8, 2015 (TW) .............................. 104114826 A

(51) Int. Cl.
*G06F 1/12* (2006.01)
*G06F 1/14* (2006.01)
*H03L 1/00* (2006.01)

(52) U.S. Cl.
CPC .................. *G06F 1/12* (2013.01); *G06F 1/14* (2013.01); *H03L 1/00* (2013.01)

(58) Field of Classification Search
CPC ..................................... G06F 1/08; H04L 27/06
See application file for complete search history.

(56) References Cited

U.S. PATENT DOCUMENTS

| 6,297,705 B1* | 10/2001 | Williams | H03L 7/08 327/159 |
| 7,283,000 B2* | 10/2007 | Yang | H03L 7/093 331/1 A |
| 7,421,251 B2* | 9/2008 | Westwick | H03L 7/00 455/141 |
| 8,244,940 B2* | 8/2012 | Ishii | G06F 13/385 710/105 |
| 8,359,489 B2* | 1/2013 | Shen | H03L 7/08 710/305 |
| 8,626,979 B2* | 1/2014 | Wang | G06F 13/387 709/230 |

(Continued)

FOREIGN PATENT DOCUMENTS

TW 201212544 A 3/2012
TW 201416820 A 5/2014

OTHER PUBLICATIONS

Examination and Search Report for Taiwanese Patent Application No. 104114826 prepared by the Taiwanese Patent Office dated Mar. 16, 2016. (including English translation of Search Report), 7 pages.

*Primary Examiner* — Henry Tsai
*Assistant Examiner* — Christopher A Daley
(74) *Attorney, Agent, or Firm* — Haynes and Boone, LLP

(57) ABSTRACT

The configuration of an apparatus for automatically calibrating a clock of a non-crystal oscillator and method thereof are disclosed. The proposed method for automatically calibrating the clock of the non-crystal oscillator includes sending a NACK signal to a host and fine-tuning the clock of the non-crystal oscillator via a frequency calibration system for non-crystal oscillator when a USB device receives an in-token command from the host, and outputting a datum from the USB device to the host.

8 Claims, 3 Drawing Sheets

(56) References Cited

U.S. PATENT DOCUMENTS

| | | | | |
|---|---|---|---|---|
| 8,634,506 | B2* | 1/2014 | Hsiao | H03L 7/1077 |
| | | | | 327/141 |
| 9,191,192 | B2* | 11/2015 | Chen | H04L 7/033 |
| 9,886,400 | B2* | 2/2018 | Zheng | G06F 13/102 |
| 9,904,312 | B2* | 2/2018 | Lu | G06F 1/08 |
| 2004/0148539 | A1* | 7/2004 | Leydier | G06F 1/04 |
| | | | | 713/500 |
| 2006/0021491 | A1* | 2/2006 | Greco | H03L 7/0995 |
| | | | | 84/293 |
| 2010/0313059 | A1* | 12/2010 | Wang | H03L 7/07 |
| | | | | 713/502 |

* cited by examiner

APPARATUS FOR AUTOMATICALLY CALIBRATING CLOCK OF NON-CRYSTAL OSCILLATOR AND METHOD THEREOF

CROSS-REFERENCES TO RELATED APPLICATIONS

The application claims the benefit of Taiwan Patent Application No. 104114826, filed on May 8, 2015, at the Taiwan Intellectual Property Office, the disclosure of which is incorporated herein in its entirety by reference.

FIELD OF THE INVENTION

The present invention relates to an apparatus for automatically calibrating a clock of a non-crystal oscillator and method thereof. In particular, it relates to a clock calibration circuit having a universal serial bus (USB) device and a non-crystal oscillator, and method thereof for automatically calibrating a clock of the non-crystal oscillator.

BACKGROUND OF THE INVENTION

Recently, the most common calibration apparatuses and methods for non-crystal oscillators include two categories: 1. apparatuses and methods using the interval between SOFs (start of frames) of 1 ms±0.05% as the basis of calibration, and 2. apparatuses and methods using the width of synchronization sequence (SYNC) as the basis of calibration. The calibration accuracies of these two categories are influenced by the number of SOFs before the "setup token" command sent by a host.

Thus, how to further decrease the calibration time of the non-crystal oscillator to save the related manpower and material is worthy of further research and improvement.

Keeping the drawbacks of the prior art in mind, and persistently employing experiments and research, the applicant has finally conceived of an apparatus for automatically calibrating a clock of a non-crystal oscillator and a method thereof. The present invention forces the host to send the "in token" command continuously before the calibration reaches the required accuracy, and accurate data are sent to the host until the calibration has been accomplished to achieve the effect of self-controlled optimization.

SUMMARY OF THE INVENTION

It is a primary objective of the present invention to disclose an apparatus for automatically calibrating a clock of a non-crystal oscillator, wherein right before leaving the factory, the clock of the RC oscillator is coarse-tuned to set the clock to be within a clock specification value of ±3%, and when the USB device is operated, the clock of the non-crystal oscillator is fine-tuned via the in token frame of the USB signal to reach the clock specification of the USB device such that the calibration time can be saved, and the required manpower and material can be decreased accordingly.

According to the first aspect of the present invention, a method for automatically calibrating a clock of a non-crystal oscillator comprises steps of: providing a clock calibration system including a host and a clock calibration circuit having a USB device and the non-crystal oscillator; replying with an acknowledgement (ACK) signal from the USB device to the host when the host sends a "setup token" command to the USB device; sending an "in token" command from the host to the USB device when the host receives the ACK signal, wherein the host is prepared to receive data from the USB device; replying with a negative-acknowledgement (NACK) signal from the USB device to the host; fine-tuning the clock of the non-crystal oscillator; and outputting the data from the USB device to the host when the clock of the non-crystal oscillator has been calibrated.

According to the second aspect of the present invention, a method for automatically calibrating a clock of a non-crystal oscillator comprises: replying with an acknowledgement (ACK) signal from a USB device to a host when the host sends a "setup token" command to the USB device; sending an "in token" command from the host to the USB device when the host receives the ACK signal; replying with a negative-acknowledgement (NACK) signal from the USB device to the host; fine-tuning the clock; and outputting a datum from the USB device to the host when the clock has been calibrated.

According to the third aspect of the present invention, an apparatus for automatically calibrating a clock of a non-crystal oscillator comprises a host, a microcontroller outputting a control signal, and a clock calibration circuit having a universal serial bus (USB) device electrically connected to the host, an IN_TOKEN pulse generator, a counter, a calibration circuit for non-crystal oscillator and the non-crystal oscillator, wherein the non-crystal oscillator receives the control signal to determine whether the clock is in one of a range of a low speed transmission mode and a range of a full speed transmission mode, and is electrically connected to the calibration circuit for non-crystal oscillator, the IN_TOKEN pulse generator is electrically connected to the USB device, the counter is electrically connected to the IN_TOKEN pulse generator, the calibration circuit for non-crystal oscillator and the non-crystal oscillator, and when the clock has been calibrated, the USB device sends a datum to the host.

The present invention can be best understood through the following descriptions with reference to the accompanying drawings, in which:

DETAILED DESCRIPTION OF THE PREFERRED EMBODIMENT

Although the following description contains many specifications for the purposes of illustration, anyone of ordinary skill in the art will appreciate that many variations and alterations to the following details are within the scope of the invention. Accordingly, the following preferred embodiment of the invention is set forth without any loss of generality to and without imposing limitations upon, the claimed invention.

Figure 1:
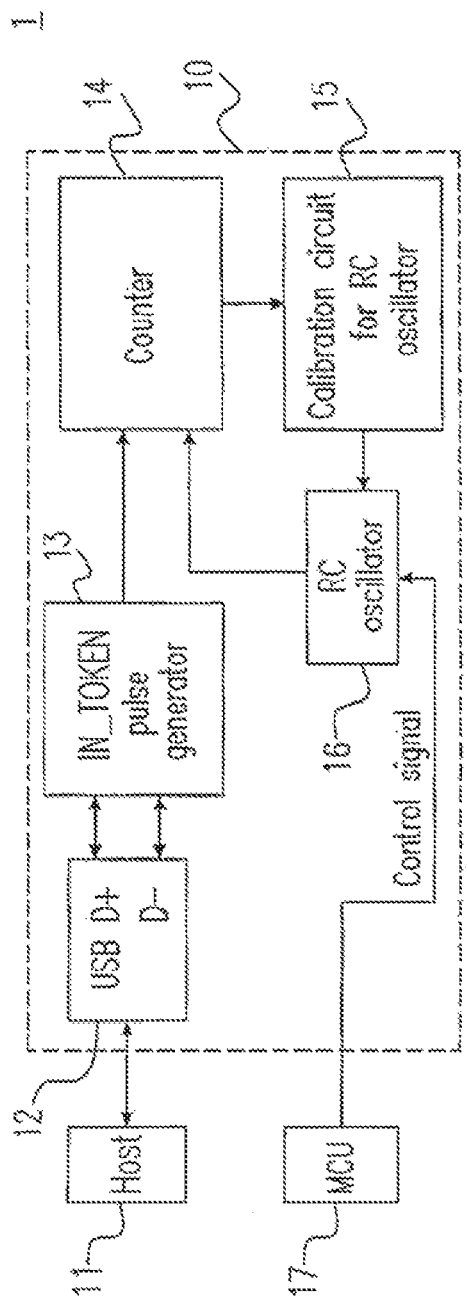
FIG. 1 shows a block diagram of a clock calibration system for non-crystal oscillator according to the first preferred embodiment of the present invention.

FIG. 1 shows a block diagram of a clock calibration system for non-crystal oscillator according to the first preferred embodiment of the present invention. In FIG. 1, the apparatus for automatically calibrating a clock of a non-crystal oscillator (e.g., an RC oscillator 16) is a clock calibration system for non-crystal oscillator 1 including a host 11, a microcontroller (MCU) 17 outputting a control signal and a clock calibration circuit 10 having a universal serial bus (USB) device 12, an IN_TOKEN pulse generator 13, a counter 14, a calibration circuit for non-crystal oscillator (e.g., a calibration circuit for RC oscillator 15) and the RC oscillator 16, wherein the USB device 12 is electrically connected to the host 11, the RC oscillator 16 receives the control signal to determine whether the clock is in one of a range of a low speed transmission mode and a range of a full speed transmission mode, and is electrically connected to the calibration circuit for non-crystal oscillator 15, the IN_TOKEN pulse generator 13 receives a differential pair of signals D+ and D− from the USB device, the counter 14 is electrically connected to the IN_TOKEN pulse generator 13, the calibration circuit for non-crystal oscillator 15 and the RC oscillator 16, and when the clock has been calibrated, the USB device 12 sends a datum to the host 11.

Figure 2:
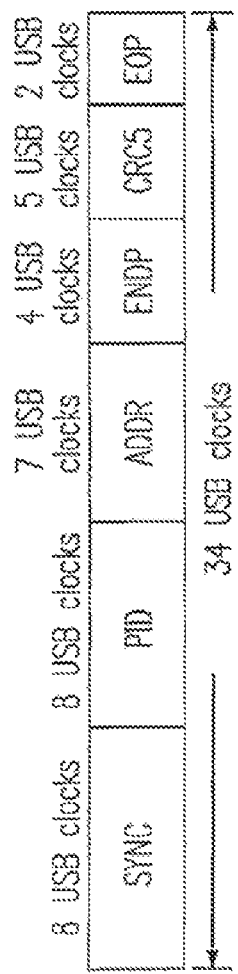
FIG. 2 shows a schematic diagram of compositions and their widths included in an IN-TOKEN pulse according to the first preferred embodiment of the present invention.

FIG. 2 shows a schematic diagram of compositions and their widths included in an IN-TOKEN pulse according to the first preferred embodiment of the present invention. A width of the IN_TOKEN pulse is 34 USB clocks including a synchronization sequence (SYNC) having a width of 8 USB clocks, a packet ID (PID) having a width of 8 USB clocks, an address (ADDR) having a width of 7 USB clocks, an endpoint (ENDP) having a width of 4 USB clocks, a Cyclic Redundancy Codes of order five (CRC5) having a width of 5 USB clocks, and an end of packet (EOP) having a width of 2 USB clocks. This width of 34 USB clocks=34*4=136 calibrated clocks, when there is a difference of 1 calibrated clock, the error is 1/136=0.74%, and to achieve the calibration error of 0.25% under the full speed transmission mode, four IN_TOKEN pulses have to be accumulated so as to be calibrated once such that a calibration target of 0.185% is achieved.

Figure 3A:
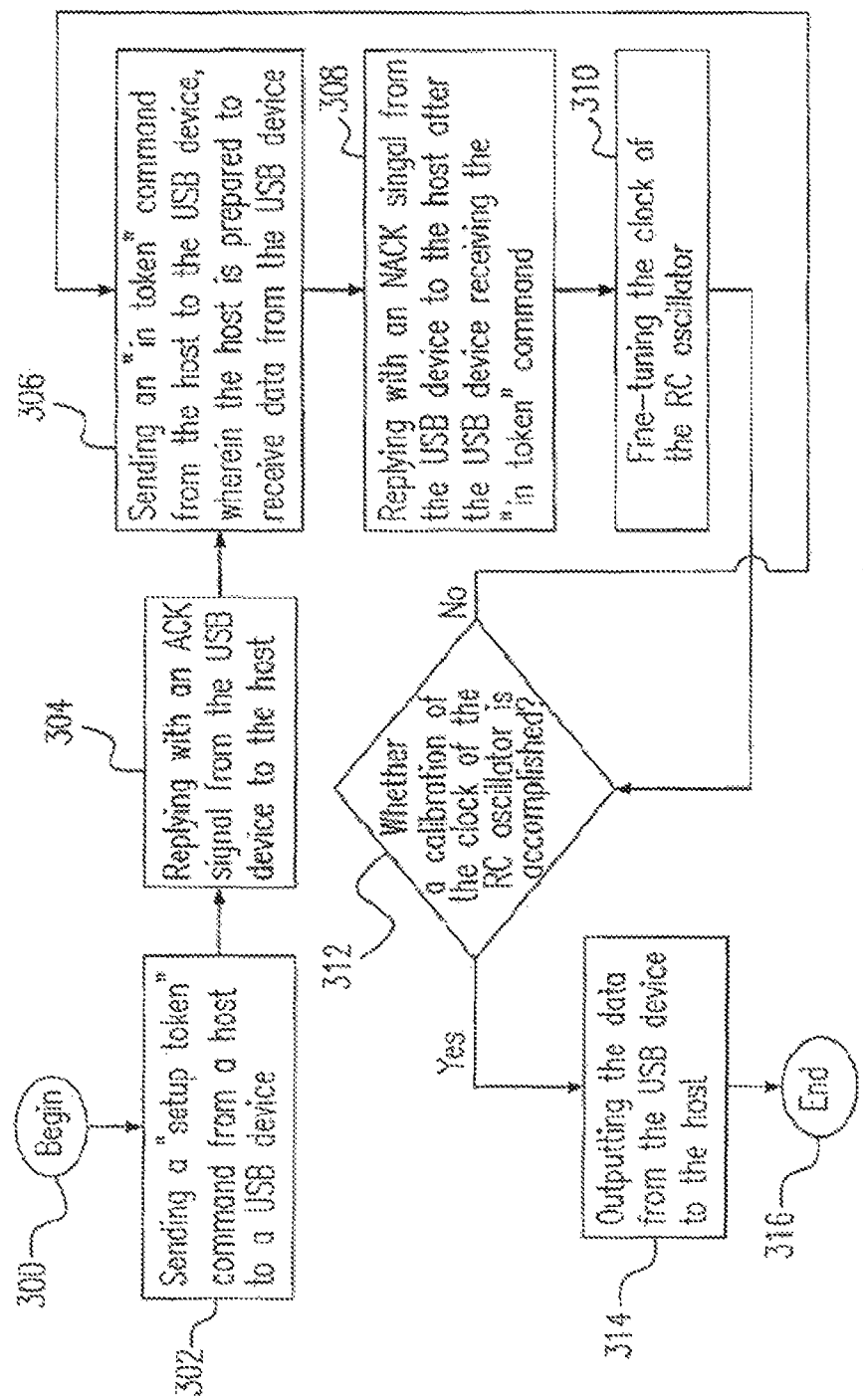
FIG. 3(a) shows a flowchart of a method for automatically calibrating a clock of a non-crystal oscillator according to the second preferred embodiment of the present invention.

FIG. 3(a) shows a flowchart of a method for automatically calibrating a clock of a non-crystal oscillator (e.g., an RC oscillator) according to the second preferred embodiment of the present invention. In FIG. 3(a), the method includes step 300: Begin; step 302: Giving (or Sending) a "setup token" command from a host to a USB device; step 304: Replying with an ACK signal from the USB device to the host; step 306: Giving (or Sending) an "in token" command from the host to the USB device, wherein the host is prepared to receive data from the USB device; step 308: Replying with an NACK signal from the USB device to the host after the USB device receiving the "in token" command; step 310: Fine-tuning the clock of the RC oscillator; step 312: Whether a calibration of the clock of the RC oscillator is accomplished? If not, go back to step 306, and if yes, jump to step 314: Outputting the data from the USB device to the host; and step 316: End.

Figure 3B:
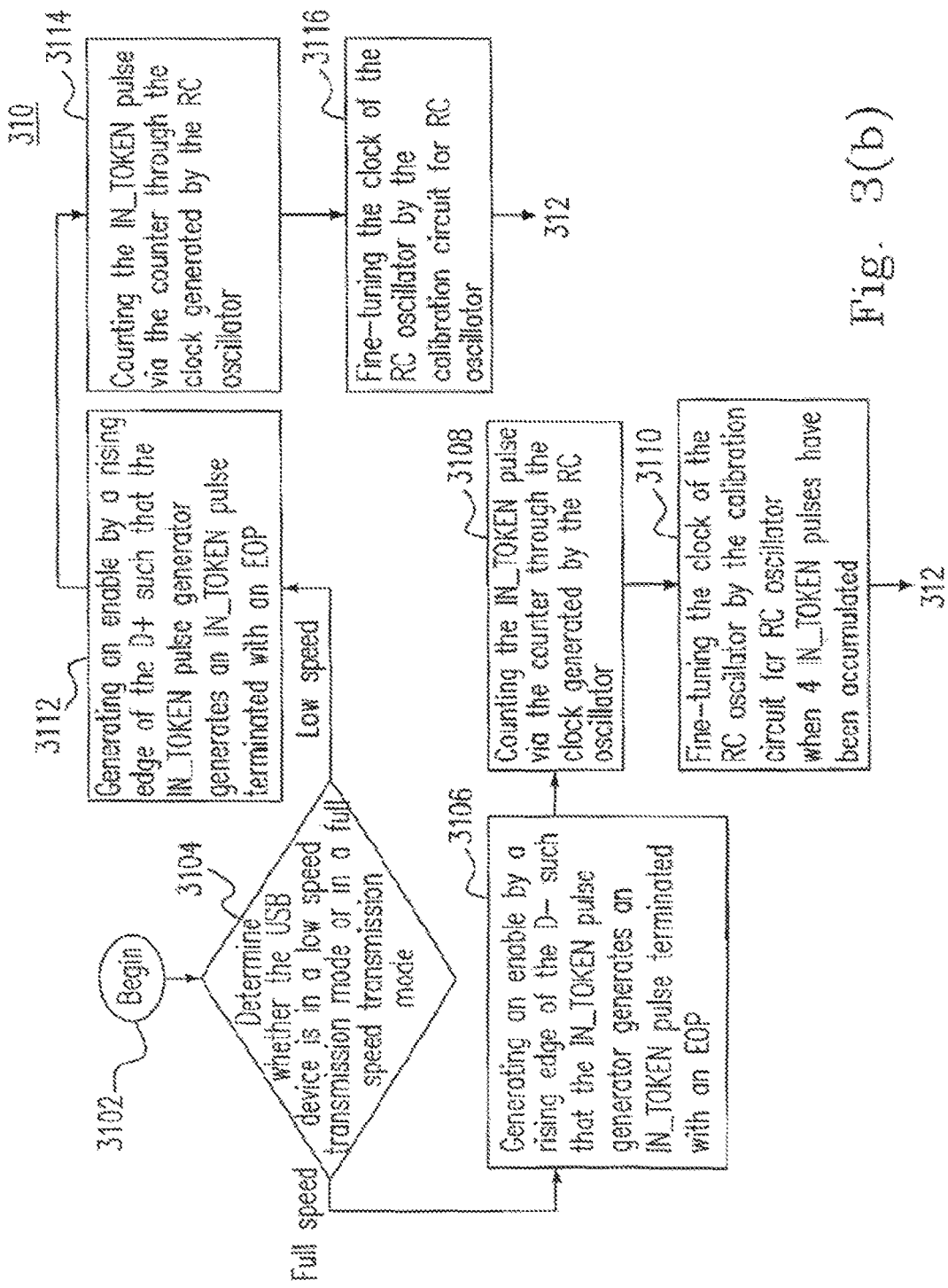
FIG. 3(b) shows a detailed flowchart of step 310 of the method for automatically calibrating the clock of the non-crystal oscillator according to the second preferred embodiment of the present invention.

FIG. 3(b) shows a detailed flowchart of step 310 of the method for automatically calibrating the clock of the non-crystal oscillator according to the second preferred embodiment of the present invention. In FIG. 3(b), the method includes step 3102: Begin; step 3104: Determine whether the USB device is in a low speed transmission mode or in a full speed transmission mode; If the USB device is in the full speed, jump to step 3106: Generating an enable by a rising edge of the D− such that the IN_TOKEN pulse generator generates an IN_TOKEN pulse terminated with an EOP signal; If the USB device is in the low speed, jump to step 3112: Generating an enable by a rising edge of the D+ such that the IN_TOKEN pulse generator generates an IN_TO-KEN pulse terminated with an EOP signal; Jump from step 3106 to step 3108: Counting the IN_TOKEN pulse via the counter through the clock generated by the RC oscillator; Jump from step 3108 to step 3110: Fine-tuning the clock of the RC oscillator by the calibration circuit for the RC oscillator when 4 IN_TOKEN pulses have been accumulated; Jump from step 3112 to step 3114: Counting the IN_TOKEN pulse via the counter through the clock generated by the RC oscillator; Jump from step 3114 to step 3116: Fine-tuning the clock of the RC oscillator by the calibration circuit for the RC oscillator; Jump from step 3110 to step 312; and Jump from step 3116 to step 312.

EMBODIMENTS

1. A method for automatically calibrating a clock of a non-crystal oscillator, comprising steps of:
providing a clock calibration system including a host and a clock calibration circuit having a USB device and the non-crystal oscillator;
replying with an acknowledgement (ACK) signal from the USB device to the host when the host sends a "setup token" command to the USB device;
sending an "in token" command from the host to the USB device when the host receives the ACK signal, wherein the host is prepared to receive data from the USB device;
replying with a negative-acknowledgement (NACK) signal from the USB device to the host;
fine-tuning the clock of the non-crystal oscillator by using the in token command; and
outputting the data from the USB device to the host when the clock of the non-crystal oscillator has been calibrated.

2. The method according to Embodiment 1, wherein the clock calibration circuit further comprises an IN_TOKEN pulse generator, a counter and a calibration circuit for non-crystal oscillator, the USB device receives a pair of differential signals D+ and D− from the host, and the fine-tuning step further comprises:
generating an enable by a rising edge of the D+ when the USB device is in a low speed transmission mode and generating an enable by a rising edge of the D− when the USB device is in a full speed transmission mode such that the IN_TOKEN pulse generator generates an IN_TOKEN pulse terminated with an end of packet (EOP);
causing the clock calibration circuit to count the IN_TO-KEN pulse via the counter through the clock generated by the non-crystal oscillator;
fine-tuning the clock of the non-crystal oscillator by the calibration circuit for non-crystal oscillator when the USB is in the low speed transmission mode; and
fine-tuning the clock of the non-crystal oscillator by the calibration circuit for non-crystal oscillator when the USB is in the full speed transmission mode and four IN_TOKEN pulses have been accumulated.

3. The method according to Embodiment 1 or 2, wherein the non-crystal oscillator is a resistor-capacitor (RC) oscillator, and right before leaving the factory, the clock of the RC oscillator is coarse-tuned to set the clock to be within a first specification of 6 MHz±a % when the USB device is in the low speed transmission mode, and to set the clock to be within a second specification of 48 MHz±a % when the USB device is in the full speed transmission mode; after the USB device has been calibrated, the clock is set within a third specification of 6 MHz±1.5% when the USB is in the low speed transmission mode, and the clock is set within a fourth specification of 48 MHz±0.25% when the USB device is in the full speed transmission mode, where a is a real number and is selected such that when the clock is within one of the first specification and the second specification, and the USB device sends the ACK signal to the host, the ACK signal is recognizable to the host.

4. The method according to any one of the above-mentioned Embodiments, wherein a width of the IN_TOKEN pulse is 34 USB clocks, and within this width, the USB clocks include a synchronization sequence (SYNC) having a width of 8 USB clocks, a packet ID (PID) having a width of 8 USB clocks, an address (ADDR) having a width of 7 USB clocks, an endpoint (ENDP) having a width of 4 USB clocks, a Cyclic Redundancy Codes of order five (CRC5) having a width of 5 USB clocks, and the EOP having a width of 2 USB clocks.

5. A method for automatically calibrating a clock of a non-crystal oscillator, comprising:
replying with an acknowledgement (ACK) signal from a USB device to a host when the host sends a "setup token" command to the USB device;
sending an "in token" command from the host to the USB device when the host receives the ACK signal;
replying with a negative-acknowledgement (NACK) signal from the USB device to the host;
fine-tuning the clock by using the in token command; and
outputting a datum from the USB device to the host when the clock has been calibrated.

6. The method according to Embodiment 5, further comprising providing a clock calibration system including the host and a clock calibration circuit having the USB device, the non-crystal oscillator, an IN_TOKEN pulse generator, a counter and a calibration circuit for non-crystal oscillator, wherein the USB device receives a pair of differential signals D+ and D− from the host, and the fine-tuning step further comprises:
generating an enable by a rising edge of the D+ when the USB device is in a low speed transmission mode and generating an enable by a rising edge of the D− when the USB device is in a full speed transmission mode such that the IN_TOKEN pulse generator generates an IN_TOKEN pulse terminated with an end of packet (EOP);
causing the clock calibration circuit to count the IN_TOKEN pulse via the counter through the clock generated by the non-crystal oscillator;
fine-tuning the clock of the non-crystal oscillator by the calibration circuit for non-crystal oscillator when the USB is in the low speed transmission mode; and
fine-tuning the clock of the non-crystal oscillator by the calibration circuit for non-crystal oscillator when the USB is in the full speed transmission mode and four IN_TOKEN pulses have been accumulated.

7. An apparatus for automatically calibrating a clock of a non-crystal oscillator, comprising:
a host;
a microcontroller outputting a control signal; and
a clock calibration circuit having a universal serial bus (USB) device electrically connected to the host, an IN_TOKEN pulse generator, a counter, a calibration circuit for non-crystal oscillator and the non-crystal oscillator, wherein the non-crystal oscillator receives the control signal to determine whether the clock is in one of a range of a low speed transmission mode and a range of a full speed transmission mode, and is electrically connected to the calibration circuit for non-crystal oscillator, the IN_TOKEN pulse generator is electrically connected to the USB device, the counter is electrically connected to the IN_TOKEN pulse generator, the calibration circuit for non-crystal oscillator and the non-crystal oscillator, when the USB device receives an in token command from the host, the USB device sends a NACK signal to the host, and fine-tunes the clock of the non-crystal oscillator by using the in token command, and when the clock has been calibrated, the USB device sends a datum to the host.

8. The apparatus according to Embodiment 7, wherein the host outputs a pair of differential signals D+ and D−, when the USB device receives an "in token" command from the host, the USB device sends a NACK signal to the host, and fine-tunes the clock of the non-crystal oscillator simultaneously, a rising edge of the D+ generates an enable when the USB device is in a low speed transmission mode, a rising edge of the D− generates an enable when the USB device is in a full speed transmission mode such that the IN_TOKEN pulse generator generates an IN_TOKEN pulse terminated with an end of packet (EOP), the clock calibration circuit counts the IN_TOKEN pulse via the counter through the clock generated by the non-crystal oscillator, the clock of the non-crystal oscillator is fine-tuned by the calibration circuit for non-crystal oscillator when the USB is in the low speed transmission mode, and the clock of the non-crystal oscillator is fine-tuned by the calibration circuit for non-crystal oscillator when the USB is in the full speed transmission mode and four IN_TOKEN pulses have been accumulated.

According to the descriptions above, the present invention discloses an apparatus for automatically calibrating a clock of a non-crystal oscillator, wherein right before leaving the factory, the clock of the RC oscillator is coarse-tuned to set the clock to be within a clock specification value±3%, and when the USB device is operated, the clock of the non-crystal oscillator is fine-tuned via the in token frame of the USB signal to reach the clock specification of the USB device such that the calibration time can be saved, and the required manpower and material can be decreased accordingly, which is both non-obvious and novel.

While the present invention has been described in terms of what are presently considered to be the most practical and preferred embodiments, it is to be understood that the present invention need not be restricted to the disclosed embodiments. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claimed is:
1. A method for automatically calibrating a clock of a non-crystal oscillator, comprising steps of:
providing a clock calibration system including a host and a clock calibration circuit having a USB device and the non-crystal oscillator;
replying with an acknowledgement (ACK) signal from the USB device to the host when the host sends a "setup token" command to the USB device;
sending an "in token" command from the host to the USB device when the host receives the ACK signal, wherein the host is prepared to receive data from the USB device;

replying with a negative-acknowledgement (NACK) signal from the USB device to the host after the USB device receives the "in token" command;
fine-tuning the clock of the non-crystal oscillator by using the "in-token" command; and
outputting the data from the USB device to the host when the clock of the non-crystal oscillator has been calibrated.

2. The method according to claim 1, wherein the clock calibration circuit further comprises an IN_TOKEN pulse generator, a counter and a calibration circuit for non-crystal oscillator, the USB device receives a pair of differential signals D+ and D− from the host, and the fine-tuning step further comprises:
generating an enable by a rising edge of the D+ when the USB device is in a low speed transmission mode and generating an enable by a rising edge of the D− when the USB device is in a full speed transmission mode such that the IN_TOKEN pulse generator generates an IN_TOKEN pulse terminated with an end of packet (EOP);
causing the clock calibration circuit to count the IN_TOKEN pulse via the counter through the clock generated by the non-crystal oscillator;
fine-tuning the clock of the non-crystal oscillator by the calibration circuit for non-crystal oscillator when the USB is in the low speed transmission mode; and
fine-tuning the clock of the non-crystal oscillator by the calibration circuit for non-crystal oscillator when the USB is in the full speed transmission mode and four IN_TOKEN pulses have been accumulated.

3. The method according to claim 2, wherein the non-crystal oscillator is a resistor-capacitor (RC) oscillator, and right before leaving the factory, the clock of the RC oscillator is coarse-tuned to set the clock to be within a first specification of 6 MHz±a % when the USB device is in the low speed transmission mode, and to set the clock to be within a second specification of 48 MHz±a % when the USB device is in the full speed transmission mode; after the USB device has been calibrated, the clock is set within a third specification of 6 MHz±1.5% when the USB is in the low speed transmission mode, and the clock is set within a fourth specification of 48 MHz±0.25% when the USB device is in the full speed transmission mode, where a is a real number and is selected such that when the clock is within one of the first specification and the second specification, and the USB device sends the ACK signal to the host, the ACK signal is recognizable to the host.

4. The method according to claim 2, wherein a width of the IN_TOKEN pulse is 34 USB clocks, and within this width, the USB clocks include a synchronization sequence (SYNC) having a width of 8 USB clocks, a packet ID (PID) having a width of 8 USB clocks, an address (ADDR) having a width of 7 USB clocks, an endpoint (ENDP) having a width of 4 USB clocks, a Cyclic Redundancy Codes of order five (CRC5) having a width of 5 USB clocks, and the EOP having a width of 2 USB clocks.

5. A method for automatically calibrating a clock of a non-crystal oscillator, comprising:
replying with an acknowledgement (ACK) signal from a USB device to a host when the host sends a "setup token" command to the USB device;
sending an "in token" command from the host to the USB device when the host receives the ACK signal;
replying with a negative-acknowledgement (NACK) signal from the USB device to the host after the USB device receives the "in token" command;
fine-tuning the clock by using the "in-token" command; and
outputting a datum from the USB device to the host when the clock has been calibrated.

6. The method according to claim 5, further comprising providing a clock calibration system including the host and a clock calibration circuit having the USB device, the non-crystal oscillator, an IN_TOKEN pulse generator, a counter and a calibration circuit for non-crystal oscillator, wherein the USB device receives a pair of differential signals D+ and D− from the host, and the fine-tuning step further comprises:
generating an enable by a rising edge of the D+ when the USB device is in a low speed transmission mode and generating an enable by a rising edge of the D− when the USB device is in a full speed transmission mode such that the IN_TOKEN pulse generator generates an IN_TOKEN pulse, and the IN_TOKEN pulse is terminated with an end of packet (EOP);
causing the clock calibration circuit to count the IN_TOKEN pulse via the counter through the clock generated by the non-crystal oscillator;
fine-tuning the clock of the non-crystal oscillator by the calibration circuit for non-crystal oscillator when the USB is in the low speed transmission mode; and
fine-tuning the clock of the non-crystal oscillator by the calibration circuit for non-crystal oscillator when the USB is in the full speed transmission mode and four IN_TOKEN pulses have been accumulated.

7. An apparatus for automatically calibrating a clock of a non-crystal oscillator, comprising:
a host;
a microcontroller outputting a control signal; and
a clock calibration circuit having a universal serial bus (USB) device electrically connected to the host, an IN_TOKEN pulse generator, a counter, a calibration circuit for non-crystal oscillator and the non-crystal oscillator, wherein the non-crystal oscillator receives the control signal to determine whether the clock is in one of a range of a low speed transmission mode and a range of a full speed transmission mode, and is electrically connected to the calibration circuit for non-crystal oscillator, the IN_TOKEN pulse generator is electrically connected to the USB device, the counter is electrically connected to the IN_TOKEN pulse generator, the calibration circuit for non-crystal oscillator and the non-crystal oscillator, when the USB device receives an "in token" command from the host, the USB device sends a NACK signal to the host after the USB device receives the "in token" command, and fine-tunes the clock of the non-crystal oscillator by using the "in token" command, and when the clock has been calibrated, the USB device sends a datum to the host.

8. The apparatus according to claim 7, wherein the host outputs a pair of differential signals D+ and D−, a rising edge of the D+ generates an enable when the USB device is in a low speed transmission mode, a rising edge of the D− generates an enable when the USB device is in a full speed transmission mode such that the IN_TOKEN pulse generator generates an IN_TOKEN pulse, the IN_TOKEN pulse is terminated with an end of packet (EOP) signal, the clock calibration circuit counts the IN_TOKEN pulse via the counter through the clock generated by the non-crystal oscillator, the clock of the non-crystal oscillator is fine-tuned by the calibration circuit for non-crystal oscillator when the USB is in the low speed transmission mode, and the clock of the non-crystal oscillator is fine-tuned by the calibration circuit for non-crystal oscillator when the USB is in the full speed transmission mode and four IN_TOKEN pulses have been accumulated.

\* \* \* \* \*